(12) United States Patent
Asukata

(10) Patent No.: US 6,699,643 B2
(45) Date of Patent: Mar. 2, 2004

(54) STAMPER MANUFACTURING METHOD

(75) Inventor: Takayuki Asukata, Atsugi (JP)

(73) Assignee: Nippon Columbia Co., Ltd., Tokyo (JP)

(*) Notice: Subject to any disclaimer, the term of this patent is extended or adjusted under 35 U.S.C. 154(b) by 174 days.

(21) Appl. No.: 09/960,492

(22) Filed: Sep. 24, 2001

(65) Prior Publication Data
US 2002/0039705 A1 Apr. 4, 2002

(30) Foreign Application Priority Data
Sep. 25, 2000 (JP) .......................... 2000-289897

(51) Int. Cl.⁷ .................................................. G03C 5/00
(52) U.S. Cl. ...................... 430/315; 430/320; 430/325; 430/330
(58) Field of Search ................................ 430/315, 320, 430/325, 330

(56) References Cited

U.S. PATENT DOCUMENTS 5,776,636 A   7/1998  Kunisawa et al. ............. 430/5
5,961,198 A  10/1999  Hira et al. ..................... 362/31
6,238,846 B1 * 5/2001  Tacken ......................... 430/320

FOREIGN PATENT DOCUMENTS

JP          4259938       9/1992

* cited by examiner

Primary Examiner—Christopher G. Young
(74) Attorney, Agent, or Firm—Dickstein Shapiro Morin & Oshinsky LLP

(57) ABSTRACT

It is an object to provide a stamper manufacturing method capable of shortening a time taken for manufacturing a stamper without requiring special equipment such as a dry etching device. The stamper manufacturing method comprises the steps of forming a photoresist layer (6) on one of surfaces of a conductive substrate (1), exposing a desirable portion of the photoresist layer (6), developing the photoresist layer (6), forming an electroforming body (8) on the substrate (1) in a portion from which the photoresist layer (6) is removed at the developing step, and carrying out washing to remove the photoresist layer (6) from the substrate (1).

6 Claims, 2 Drawing Sheets

HEATING

ASHING, DILUTE SULFURIC ACID TREATMENT

STAMPER MANUFACTURING METHOD

BACKGROUND OF THE INVENTION

1. Field of the Invention

The present invention relates to a method of manufacturing a stamper that is used for manufacturing a light guiding plate to be utilized for a liquid crystal display or the like.

2. Description of the Related Art

A liquid crystal display to be used for a word processor, a personal computer, a thin type television or the like usually comprises a rear-illuminating device. Most rear-illuminating devices use a light guiding plate of an edge light type. The light guiding plate of the edge light type is a transparent plate-shaped member and has an element for changing the angle of light transmitted through the light guiding plate or the angle of light reflected by the light guiding plate (which will be hereinafter referred to as a "deflecting element"). At least one of side surfaces of the light guiding plate serves as a light incident plane, and the light incident plane is provided with a light source having a tube shape or the like. The light emitted from the light source is incident through the light incident plane and is reciprocated and propagated between the upper and lower surfaces of the light guiding plate. At this time, the light having the direction changed by the deflecting element is emitted through the upper surface of the light guiding plate as illuminating light for the rear-illuminating device. Accordingly, the upper surface of the light guiding plate becomes a light emitting plane and the density distribution of the deflecting element and the shape of the deflecting element are predetermined such that the luminance of the light emitted from the light-emitting plane is uniform over the whole light emitting plane.

For the deflecting element, there are used (1) a white ink for scattering or reflecting light which is applied onto the surface of the light guiding plate, (2) a portion of projections and depressions for scattering or reflecting light which is formed on the surface of the light guiding plate, (3) light diffusing particles dispersed in the light guiding plate and the like.

In the case of the type (1), the white ink is applied by the method of screen-printing or the like. When the thickness of the white ink in a printed surface is nonuniform, a distribution is generated in the ability of the light reflection of the deflecting element. As a result, the luminance of the light emitted from the light-emitting plane of the light guiding plate becomes nonuniform. Furthermore, if dust in the air is mixed into the white ink or sticks onto the printed surface during the printing work, the light is scattered by the dust so that the uniformity of the luminance cannot be obtained. In the case of the type (3), even if the light guiding plate is to contain the deflecting element to obtain a predetermined density distribution, it is hard to disperse the light-diffusing particles into a base material with the predetermined density distribution.

For the above-mentioned reasons, the rear-illuminating device of many liquid crystal displays uses the light guiding plate of the above type (2), which includes, as a deflecting element, a portion of projections and depressions by which the light is diffused or reflected over a surface. For example, U.S. Pat. No. 5,961,198 has described a light guiding plate having a portion of projections and depressions as a deflecting element. Moreover, U.S. Pat. No. 5,776,636 has disclosed a method of manufacturing a light guiding plate including a portion of projections and depressions as the deflecting element.

Referring to FIGS. 2A to 2H, a brief description will be given to the procedure for manufacturing a light guiding plate having convex dots as a deflecting element using the method of manufacturing a light guiding plate described in the U.S. Pat. No. 5,776,636. A glass substrate 21 (FIG. 2A) has one of surfaces mirror polished and washed. A positive type photoresist is applied onto the polished surface of the glass substrate 21 by spin coating or the like, thereby forming a photoresist layer 22 (FIG. 2B). A photomask 23 being described a pattern corresponding to a plurality of dots of the light guiding plate (which will be hereinafter referred to as a "dot pattern") is provided on the photoresist layer 22, and the photoresist layer 22 is exposed through the photomask 23 (FIG. 2C). In the photomask 23, light is not transmitted through a portion corresponding to a convex dot pattern in the light guiding plate but is transmitted through a portion corresponding to a concave region between the dots in the light guiding plate. The photoresist layer 22 is exposed through the photomask 23, and a developer develops thus exposed photoresist layer 22 (FIG. 2D). Consequently, the region (exposed portion 24) in the photoresist layer 22 which has been exposed at the exposing step of FIG. 2C is removed and an unexposed portion 25 remains on the glass substrate 21.

An electric conductive film 26 is formed by vapor deposition, sputtering or the like over the whole upper surface of the glass substrate 21 on which the unexposed portion 25 of the photoresist layer 22 is provided (FIG. 2E). Then, the electric conductive film 26 is used as an electrode to form an electroforming body 27 by electroforming (FIG. 2F). Thereafter, the outer periphery is processed if necessary. Consequently, a stamper 28 including the electric conductive film 26 and the electroforming body 27 can be manufactured (FIG. 2G).

By using the stamper 28 as a mold, a resin is subjected to injection molding. Consequently, a light guiding plate 29 having a desirable dot pattern can be manufactured (FIG. 2H).

Moreover, Japanese Laid-Open Patent Publication No. Hei 4-259938 (1992/259938) has disclosed a method of manufacturing a stamper for manufacturing an information recording medium having a prepit such as a compact disk. The Japanese Laid-Open Patent Publication No. Hei 4-259938 (1992/259938) has disclosed a method manufacturing a stamper in which a silicon wafer or a metal plate is used as a substrate, and a photoresist layer is formed on the substrate of the silicon wafer or the metal plate to expose and develop a pattern and the substrate is subjected to dry etching by using the developed photoresist layer as a mask member so that a mother substrate having a concave portion formed thereon corresponding to a pre-formed pit pattern is obtained on the substrate of the silicon wafer or the metal plate. The mother substrate is thereafter subjected to the electroforming to obtain a stamper.

SUMMARY OF THE INVENTION

In the method of manufacturing a stamper described in the U.S. Pat. No. 5,776,636, the electroforming body 27 constitutes most parts of the stamper 28. For this reason, the thickness of the electroforming body 27 should be approximately 0.1 to 0.5 mm in order to obtain a mechanical strength required for the stamper 28 that is used for the injection molding. Consequently, there is a problem in that a long time is taken to the electroforming step for forming the electroforming body 27 and a manufacturing cost is increased. For example, in order to form the electroforming body 27 having a diameter of 200 mm and a thickness of 0.3 mm, a time required for electroforming is one hour or more. In order to manufacture a stamper for a light guiding plate for a large-sized liquid crystal display having a diagonal of 15 inches, a disk-shaped glass substrate having a diameter of 500 mm is to be used as the glass substrate 21. In this case, four hours or more are required for electroforming to obtain the electroforming body 27 having a thickness of 0.3 mm.

In the method of manufacturing a stamper for an information recording medium which has been disclosed in the Japanese Laid-Open Patent Publication No. Hei 4-259938 (1992/259938), a silicon wafer or metal plate having a large area is used for a substrate and a large-sized dry etching device is required for etching the substrate. Consequently, an equipment cost is increased.

In order to solve the above-mentioned problems, it is an object of the present invention to provide a stamper manufacturing method that does not require special equipment such as a dry etching device and further it is possible to shorten a time taken for manufacturing a stamper.

In order to attain the above-mentioned object, the present invention provides the following stamper manufacturing method.

More specifically, there is provided a method of manufacturing a stamper, comprising:

a forming step for forming a photoresist layer on one of surfaces of a substrate having electric conductivity;

an exposing step for exposing a desirable portion of the photoresist layer;

a developing step for developing the photoresist layer;

an electroforming step for forming an electroforming body on a portion, where the photoresist layer having been removed at the developing step, of the substrate; and a washing step for carrying out washing to remove the photoresist layer from the substrate.

BRIEF DESCRIPTION OF THE INVENTION

DESCRIPTION OF THE PREFERRED EMBODIMENTS

A method of manufacturing a stamper according to an embodiment of the present invention will be described below with reference to FIGS. 1A to 1H.

A stamper manufactured by the manufacturing method according to the present embodiment is used for manufacturing a light guiding plate to be utilized in a liquid crystal display or the like. The light guiding plate has a plurality of dots having a desirable shape and provided in a desirable pattern. Each dot is a convex portion, which protrudes from the surface of the light guiding plate.

Figure 1A:
FIGS. 1A to 1H are views illustrating a method of manufacturing a stamper according to an embodiment of the present invention.

In the present embodiment, a stamper is manufactured by using a substrate 1 having an electric conductivity (FIG. 1A). For the substrate 1, a nickel plate is used and a metallic substrate other than the nickel can also be used. The nickel plate to be used as the substrate 1 is mirror polished such that both surfaces have an arithmetic mean roughness of 0.01 μm or less. In the present embodiment, the substrate 1 has a circular shape, for example, a diameter of 500 mm and a thickness of 0.3 mm in order to form the photoresist layer 2 on the substrate 1 by spin coating as will be described below.

Figure 1B:
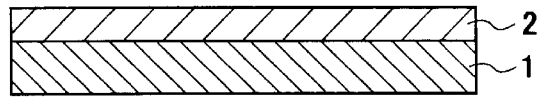

The substrate 1 is attached to a spin coating device and a negative type photoresist is applied to form a negative type photoresist layer 2 (FIG. 1B). In this case, the negative type photoresist layer 2 is formed to have a greater thickness than the height of the dot of the light guiding plate. The reason is as follows. In the case of the method of manufacturing a stamper according to the present embodiment, the depth of a gap formed between electroforming bodies 8 to be a mold for forming the dot of the light guiding plate is determined by the thickness of the electroforming body 8 formed on the upper surface of the substrate 1 in FIG. 1G which will be described below. The thickness of the electroforming body 8 cannot be greater than that of the negative type photoresist layer 2. Therefore, the thickness of the negative type photoresist layer 2 is to be greater than the height of the dot of the light guiding plate. It is sufficient that the thickness of the negative type photoresist layer 2 is greater than the height of the dot of the light guiding plate and the negative type photoresist layer 2 does not need to be formed through a highly precise thickness control.

Figure 1C:
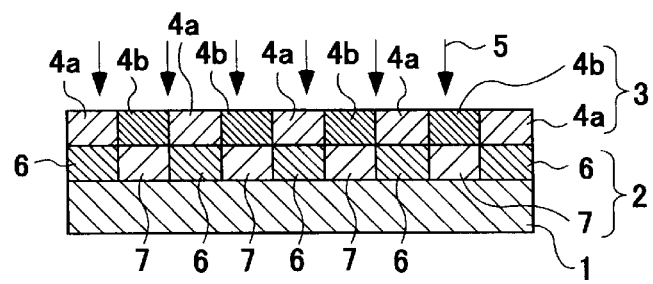

As shown in FIG. 1C, next, the negative type photoresist layer 2 is exposed by using a photomask 3. For the exposure, an ultraviolet light (UV light) 5 is used, with which the negative type photoresist layer 2 is photosensitive. At this time, a photomask having a dot pattern described thereon is used for the photomask 3 by setting a portion corresponding to the dot of the light guiding plate as an ultraviolet light transmitting portion 4a and a portion corresponding to a region between the dots of the light guiding plate as an ultraviolet light shielding portion 4b such that a region of the negative type photoresist layer 2 corresponding to the dot of the light guiding plate is exposed. During the exposure, the photomask 3 is caused to come in close contact with the surface of the negative type photoresist layer 2 to irradiate the ultraviolet light from the upper surface of the photomask 3. Consequently, the portion corresponding to the dot of the light guiding plate, of the negative type photoresist layer 2, becomes an exposed portion 6 and the portion corresponding to the region between the dots of the light guiding plate becomes an unexposed portion 7.

Figure 1D:
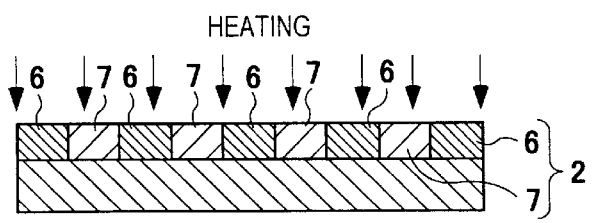
Figure 1E:
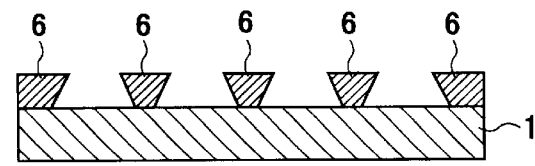

Next, as shown in FIG. 1D, the substrate 1 is put in a clean oven and the negative type photoresist layer 2 is heated for five minutes at 90° C. (post-exposure baking). At this time, the negative type photoresist layer 2 is heated from the surface side in the present embodiment. For this reason, the substrate 1 is provided in the clean oven such that the heat source of the clean oven is positioned at the surface side of the negative type photoresist layer 2. In general, the negative type photoresist is constituted such that a catalyst is generated in the exposed portion and a crosslinking reaction progresses in the exposed portion more than in the exposed portion during the heating. For this reason, a dissolving speed for a developer in the unexposed portion is made lower than that in the unexposed portion. Also in the case of the negative type photoresist layer 2 according to the present embodiment, since the crosslinking reaction progresses in the exposed portion 6 more than in the unexposed portion 7, when development is carried out by using a developer and washing is performed with pure water, the unexposed portion 7 is dissolved in the developer, then removed, and the exposed portion 6 remains on the substrate 1 (FIG. 1E). In addition, the heating is carried out from the surface side of the negative type photoresist layer 2 as described above at the heating step of FIG. 1D in the present embodiment. Therefore, in the exposed portion 6, a portion on the surface side of the negative type photoresist layer 2 is heated more quickly than a portion on the substrate 1 side of the negative type photoresist layer 2, and the crosslinking reaction of the exposed portion 6 progresses more rapidly on the surface side of the negative type photoresist layer 2 than the substrate 1 side of the negative type photoresist layer 2. Consequently, the dissolution in the developer in the exposed portion 6 progresses more quickly on the substrate 1 side than the surface side of the negative type photoresist layer 2, and the cross-sectional shape of the exposed portion 6 in the negative type photoresist layer 2 remaining after the development is a trapezoid having a lower bottom (the side in contact with the substrate 1) which is shorter than an upper bottom (the surface side) as shown in FIG. 1E.

Figure 1F:
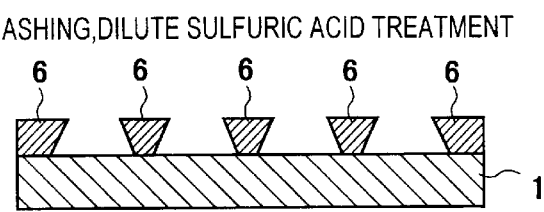

Next, the substrate 1 is attached to an ashing device to carry out an oxygen ashing treatment or an UV ozone ashing treatment. Consequently, the upper surface of the substrate 1 exposed between the exposed portions 6 is processed to remove a resist residue remaining on the surface of the substrate 1 (FIG. 1F). Thus, a portion corresponding to the dot of the light guiding plate of the substrate 1 is covered with the exposed portion 6 of the negative type photoresist layer 2 and other portions are brought in a state in which the substrate surface having no resist residue is exposed. Subsequently, the substrate 1 is immersed in a dilute sulfuric acid solution and an oxide film on the surface of the substrate 1 is removed. Consequently, the substrate 1 exposed between the exposed portions 6 becomes a clean surface from which the oxide film 1 is removed. By the surface finishing step as described above, an electroforming body 8 having a great adhesive strength can be formed on the upper surface of the substrate 1 at the next electroforming step and the electroforming body 8 can be prevented from being peeled and broken off from the substrate 1.

Then, the substrate 1 through the surface finishing step is attached to the cathode of an electroforming device, thereby carrying out nickel electroforming. Consequently, the electroforming body 8 is formed in the region between the exposed portions 6 of the negative type photoresist layer 2 where the substrate 1 is exposed. In the present embodiment, an electric conductive substrate is used for the substrate 1. Therefore, it is not necessary to form a conductive film or the like on the substrate 1 and the electroforming body 8 can be directly formed by using the substrate 1 as a cathode. While nickel has been used for an electroforming substance, other metals such as chromium or copper can be used. The resin that was filled up to gap formed between the electroforming bodies 8 becomes a convex dot of the light guiding plate. Therefore, the thickness of the electroforming body 8 corresponds to the height of the dot of the light guiding plate. In general, it is proper that the height of the dot having the convex shape of the light guiding plate is approximately 2 to 50 $\mu$m. In the present embodiment, therefore, nickel electroforming is carried out until the electroforming body 8 has a desirable thickness of 2 to 50 $\mu$m. In the present embodiment, since the electroforming body 8 is thin, i.e., 2 to 50 $\mu$m, it is sufficient that a time required for the electroforming is approximately several minutes to several tens minutes. A current value during the electroforming is set such that the thickness of the electroforming body 8 can easily be controlled and the surface of the electroforming body 8 can be smoothened. For example, a low current value of approximately 0.1 to 1 A is preferable.

Figure 1G:
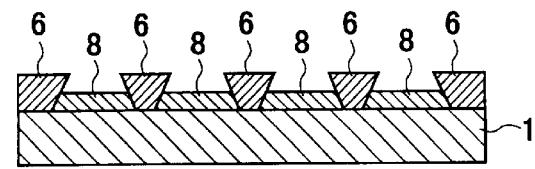

In the present embodiment described above, the cross-sectional shape of the exposed portion 6 in the negative type photoresist layer 2 provided on the substrate 1 is a trapezoid having a lower bottom (the side in contact with the substrate 1), which is shorter than an upper bottom (the surface side). Therefore, the cross-sectional shape of the electroforming body 8 formed at the electroforming step in FIG. 1G is a trapezoid having an upper bottom (the surface side), which is shorter than a lower bottom (the side in contact with the substrate 1).

Figure 1H:
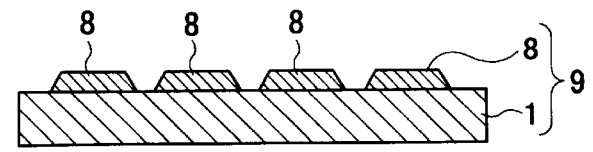
Figure 2A:
FIGS. 2A to 2G are views illustrating a conventional method of manufacturing a stamper.
Figure 2B:
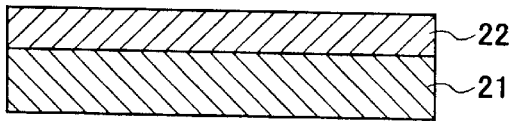
Figure 2C:
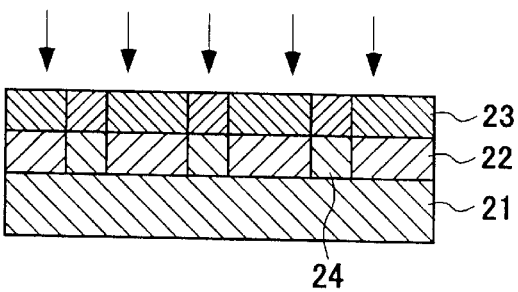
Figure 2D:
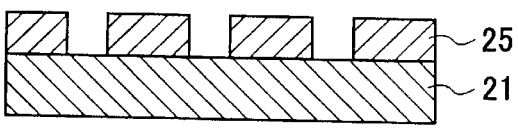
Figure 2E:
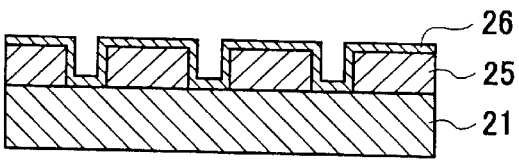
Figure 2F:
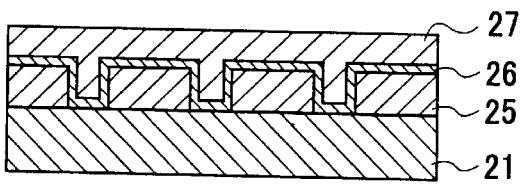
Figure 2G:
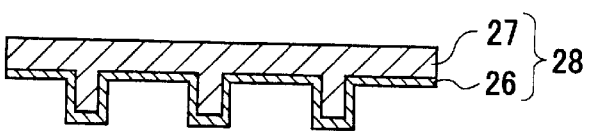
Figure 2H:
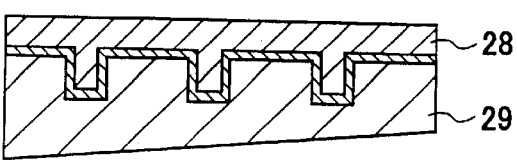
FIG. 2H is a view illustrating a method of manufacturing a light guiding plate having a dot on a surface, by using the stamper in FIG. 2G.

Next, the substrate 1 subjected to the electroforming step is washed with a photoresist remover, acetone, alcohol or the like. Consequently, the exposed portion 6 of the negative type photoresist layer 2 on the substrate 1 is removed (FIG. 1H). Then, the back face of the substrate 1 is polished if necessary and the outer periphery of the disk-like substrate 1 is processed to have a desirable shape, for example, a quadrangle or the like to complete a stamper 9.

Brief description will be given to a method of manufacturing a light guiding plate by using the stamper 9 according to the present embodiment. The stamper 9 is attached into the mold of an injection-molding machine and a molten resin such as an acryl resin is injected into the mold. After the resin and the mold are cooled, the resin is taken out of the mold. Consequently, it is possible to manufacture a light guiding plate having a convex dot.

According to the method of manufacturing a stamper in accordance with the present embodiment describe above, it is sufficient that the electroforming is carried out until the thickness of the electroforming body 8 reaches the height of the dot of the light guiding plate to be obtained (usually, approximately 2 to 50 $\mu$m), and a time taken for the electroforming is short, that is approximately several minutes to several tens minutes. Therefore, differently from the conventional art, it is not necessary to carry out the electroforming for a long time until the thickness of the electroforming body reaches that of the stamper (generally, 0.1 to 0.5 mm). In the method of manufacturing a stamper according to the present embodiment, thus, it is possible to shorten the time required for the electroforming step. Moreover, since the substrate 1 has an electric conductivity, the electroforming body 8 can be directly formed by using the substrate 1 as a cathode during the electroforming. Therefore, differently from the conventional art, it is not necessary to execute the step of separately forming an electric conductive film for the electroforming. In the method of manufacturing a stamper according to the present embodiment, thus, a time taken for the electroforming is short and the substrate 1 can be directly used as a cathode for the electroforming without forming an electric conductive film for the electroforming. As compared with the conventional manufacturing method, therefore, it is possible to obtain an advantage that a time required for the manufacture can be shortened.

In the method of manufacturing a stamper according to the present embodiment, moreover, it is not necessary to etch the substrate 1. Therefore, it is possible to manufacture a stamper by using a generally inexpensive device such as a developing device and an electroforming device, without requiring special equipment such as a dry etching device.

In the method of manufacturing a stamper according to the present embodiment, the time required for the manufacture can be shortened. And further, it is possible to manufacture a stamper at a low cost, since the cost for special device is not necessary.

In the method of manufacturing a stamper according to the present embodiment, moreover, the cross-sectional shape of the exposed portion 6, which is obtained after the development of the negative type photoresist layer 2, is a trapezoid having a lower bottom (the side in contact with the substrate 1), which is shorter than an upper bottom (the surface side). Therefore, the sectional shape of the electroforming body 8 is a trapezoid having an upper bottom (the surface side), which is shorter than a lower bottom (the side in contact with the substrate 1). Accordingly, when the light guiding plate is subjected to injection molding by using the stamper 9 manufactured in the present embodiment, the convex portion (dot) formed by using a part between the electroforming bodies 8 as a mold can have a preferable shape for the dot of the light guiding plate, that is, a shape having a trapezoidal section in which an upper bottom (the surface side) is shorter than a lower bottom (the light guiding plate body side). Moreover, since the dot has such a shape, the light guiding plate can be easily peeled from the stamper after the injection molding.

While the light guiding plate including convex dots has been described in the above embodiment, the present embodiment is not restricted to the stamper for the light guiding plate that includes convex dots. It is a matter of course that the stamper for the light guiding plate that includes concave dots can also be manufactured. In the case where the stamper for the light guiding plate including concave dots is to be manufactured, it is sufficient that a portion in the negative type photoresist layer 2 corresponding to a region from which the dot of the light guiding plate has been removed is exposed at the step of FIG. 1C. More specifically, a photomask on which a dot pattern is described is used as photomask 3 by setting a portion corresponding to the dot portion of the light guiding plate as the ultraviolet light shielding portion 4b and a portion corresponding to the region formed between the dots as the ultraviolet light transmitting portion 4a. By using such a photomask 3, a stamper for a light guiding plate that includes concave dots can be manufactured by applying the other steps that are same as described above.

Moreover, while the light guiding plate including dots as a deflecting element has been described in the above embodiment, the deflecting element is not restricted to the shape of a dot but it may have a desirable shape such as a line shape. In this case, when the deflecting element is to have the convex shape, the shape of the ultraviolet light transmitting portion 4a of the photomask 3 is set to be the desirable shape of the deflecting element. When the deflecting element is to have the concave shape, the shape of the ultraviolet light shielding portion 4b of the photomask 3 is set to be the desirable shape of the deflecting element. Consequently, it is possible to manufacture a stamper for a light guiding plate that includes a concave or convex deflecting element having a desirable shape.

While the method of manufacturing a stamper to be used for manufacturing a light guiding plate has been described in the above embodiment, it is also possible to manufacture a stamper to be used for manufacturing an information recording medium by the same manufacturing method.

According to the present invention, it is possible to provide a stamper manufacturing method that does not require a special equipment such as a dry etching device and is capable of shortening a time taken for manufacturing the stamper.

What is claimed is:

1. A method of manufacturing a stamper, comprising:
    a forming step for forming a photoresist layer on a surface of an electrically conductive substrate;
    an exposing step for exposing a desirable portion of the photoresist layer;
    a developing step for developing the photoresist layer;
    an electroforming step for electroforming a body on said surface of said electrically conductive substrate, where the photoresist layer has been removed at the developing step, of the substrate, such that said stamper includes said electrically conductive substrate and said body electroformed on said surface of said electrically conductive substrate; and
    a washing step for carrying out washing to remove the photoresist layer from the substrate; and
    wherein a thickness of the electroformed body formed at the electroforming step is equal to or less than a thickness of the photoresist layer.

2. The method of manufacturing a stamper according to claim 1, wherein a cross-sectional shape of the photoresist layer remaining on the substrate after development at the developing step is a trapezoid in which an upper bottom on a surface side has a greater length than a length of a lower bottom provided in contact with the substrate.

3. The method of manufacturing a stamper according to claim 2, further comprising a heating step between the exposing step and the developing step,
    wherein at the heating step, the photoresist layer is heated at the surface side so that the portion of the photoresist layer which has been exposed at the exposing step is brought into such a state that a portion of the surface side is less dissolved than a portion of the substrate side in a developer that are used at the developing step.

4. A method of manufacturing a stamper, comprising:
    a forming step for forming a negative type photoresist layer on a surface of an electrically conductive substrate;
    an exposing step for exposing the negative type photoresist layer;
    a heating step for eating the negative type photoresist layer at a surface side;
    a developing step for developing the negative type photoresist layer, thereby removing the negative type photoresist layer in an unexposed portion at the exposing step and exposing the substrate provided under the negative type photoresist layer in the unexposed portion;
    a surface finishing step for removing a residue of the negative type photoresist in the unexposed portion that remains on the substrate at the developing step and a surface oxide film of the substrate exposed at the developing step;
    an electroforming step for electroforming a body on the substrate exposed at the developing step, such that said stamper includes said electrically conductive substrate and said body electroformed on said surface of said electrically conductive substrate;
    a washing step for carrying out washing to remove the negative type photoresist layer on the substrate; and
    wherein a thickness of the electroformed body formed at the electroforming step is equal to or less than a thickness of the photoresist layer.

5. The method of manufacturing a stamper according to claim 4, wherein a cross-sectional shape of the photoresist layer remaining on the substrate after development at the developing step is a trapezoid in which an upper bottom on a surface side has a greater length than a length of a lower bottom provided in contact with the substrate.

6. A method of manufacturing a stamper, comprising:

forming a photoresist layer on a surface of an electrically conductive substrate;

exposing a desirable portion of the photoresist layer;

developing the photoresist layer;

electroforming bodies on said surface of said electrically conductive substrate, such that said stamper include said electrically conductive substrate and said bodies electroformed on said surface of said electrically conductive substrate; and removing the photoresist layer from the substrate; and wherein a thickness of the electroformed bodies is equal to or less than a thickness of the photoresist layer.

* * * * *